US009085729B2

(12) United States Patent
Coggan et al.

(10) Patent No.: US 9,085,729 B2
(45) Date of Patent: Jul. 21, 2015

(54) BLUE EMITTERS FOR USE IN ORGANIC ELECTROLUMINESCENCE DEVICES

(75) Inventors: Jennifer A. Coggan, Cambridge (CA); Nan-Xing Hu, Oakville (CA); Hany Aziz, Oakville (CA)

(73) Assignee: LG Display Co., LTD., Seoul (KR)

(*) Notice: Subject to any disclaimer, the term of this patent is extended or adjusted under 35 U.S.C. 154(b) by 485 days.

(21) Appl. No.: 10/774,577

(22) Filed: Feb. 9, 2004

(65) Prior Publication Data

US 2005/0175857 A1    Aug. 11, 2005

(51) Int. Cl.
*H01L 51/54* (2006.01)
*C09K 11/06* (2006.01)
*H01L 51/00* (2006.01)

(52) U.S. Cl.
CPC ............ *C09K 11/06* (2013.01); *H01L 51/0058* (2013.01); *C09K 2211/1007* (2013.01);
(Continued)

(58) Field of Classification Search
CPC ............... C09K 11/06; C09K 11/1007; C09K 2211/1011; C09K 2211/1014; C09K 2211/1074; C09K 2211/1092; C09K 2211/1044; H01L 51/0058; H01L 51/0081; H01L 51/0067
USPC .................................................. 313/504, 506
See application file for complete search history.

(56) References Cited

U.S. PATENT DOCUMENTS 3,530,325 A    9/1970  Mehl et al.
4,539,507 A    9/1985  VanSlyke et al.
(Continued)

FOREIGN PATENT DOCUMENTS

EP        1167488       1/2002
JP       08-333569    * 12/1996
(Continued)

OTHER PUBLICATIONS

JPO machine translation of JP 2003-045662 published Feb. 14, 2003.*

(Continued)

*Primary Examiner* — Dawn L. Garrett
(74) *Attorney, Agent, or Firm* — McKenna Long & Aldridge LLP

(57) ABSTRACT

An electroluminescent (EL) is provided comprising an anode, an organic electroluminescent element, and a cathode wherein the electroluminescent element contains, for example, a fluorescent 1,1'-binaphthyl derivative component of Formula (I) wherein $R_1$, $R_2$, $R_3$ and $R_4$ are individual substituents or a group of substituents, each of which may be selected from the group consisting of hydrogen, or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like.

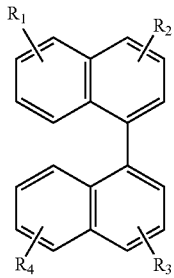

(Formula I)

16 Claims, 4 Drawing Sheets

(52) U.S. Cl.
CPC . *C09K2211/1011* (2013.01); *C09K 2211/1014* (2013.01); *C09K 2211/1044* (2013.01); *C09K 2211/1074* (2013.01); *C09K 2211/1092* (2013.01); *H01L 51/0067* (2013.01); *H01L 51/0081* (2013.01)

(56) References Cited

U.S. PATENT DOCUMENTS

| | | | |
|---|---|---|---|
| 4,583,848 | A | 4/1986 | Durbin |
| 4,720,432 | A | 1/1988 | VanSlyke et al. |
| 4,769,292 | A | 9/1988 | Tang et al. |
| 5,151,629 | A | 9/1992 | VanSlyke |
| 5,409,783 | A | 4/1995 | Tang et al. |
| 5,516,577 | A | 5/1996 | Matsuura et al. |
| 5,607,876 | A | 3/1997 | Biegelsen et al. |
| 5,763,110 | A | 6/1998 | Hu et al. |
| 5,846,666 | A | 12/1998 | Hu et al. |
| 5,925,472 | A | 7/1999 | Hu et al. |
| 5,932,363 | A | 8/1999 | Hu et al. |
| 5,942,340 | A | 8/1999 | Hu et al. |
| 5,952,115 | A | 9/1999 | Hu et al. |
| 5,985,417 | A * | 11/1999 | Shi et al. ............... 428/195.1 |
| 6,137,523 | A | 10/2000 | Fork |
| 6,479,172 | B2 | 11/2002 | Hu et al. |
| 6,582,837 | B1 * | 6/2003 | Toguchi et al. ............... 428/690 |
| 6,656,608 | B1 * | 12/2003 | Kita et al. ............... 428/690 |
| 6,660,408 | B1 | 12/2003 | Toguchi et al. |
| 6,780,529 | B2 * | 8/2004 | Kimura ............... 428/690 |
| 6,824,893 | B2 * | 11/2004 | Hoag et al. ............... 428/690 |
| 2001/0006742 | A1 * | 7/2001 | Morioka et al. ............... 428/690 |
| 2002/0127427 | A1 * | 9/2002 | Young et al. ............... 428/690 |
| 2004/0106003 | A1 * | 6/2004 | Chen et al. ............... 428/690 |
| 2004/0142206 | A1 * | 7/2004 | Bazan et al. ............... 428/690 |

FOREIGN PATENT DOCUMENTS

| | | |
|---|---|---|
| JP | 10-003037 | 12/1998 |
| JP | 11-020235 | 1/1999 |
| JP | 11-152253 * | 6/1999 |
| JP | 11-302639 * | 11/1999 |
| JP | 11-339963 | 12/1999 |
| JP | 2000-053677 * | 2/2000 |
| JP | EP 1013740 A2 * | 6/2000 |
| JP | 2000-208264 * | 7/2000 |
| JP | 2002-175883 A * | 6/2002 |
| JP | 2002-324676 * | 11/2002 |
| JP | 2003-045662 A * | 2/2003 |
| JP | 2004-014187 A * | 1/2004 |
| JP | 2004-103463 | 4/2004 |
| JP | 2005-019219 | 1/2005 |
| WO | WO 2004/067675 | 8/2004 |

OTHER PUBLICATIONS

Machine translation for JP 2002-175883 published Jun. 2002.*
Machine generated translation of detailed description portion of JP 11-152253 A, published Jun. 1999.*
Machine generated translation of detailed description portion of JP 11-302639 A, published Nov. 1999.*
Machine translation for JP 2000-053677 A. Publication Date: Feb. 2000.*
Computer-generated translation for JP 2004-014187 A (publication date Jan. 2004).*
English translation for JP 11-339963 (publication date Dec. 1999).*
Wu et al., "Integrated Three-Color Organic Light-Emitting Devices", *Appl. Phys. Lett.*, 69 (21), Nov. 18, 1996.
Anton et al., "Synthesis of n-Alkyl-Substituted Perylenes and Terrylenes via Alkali-Metal Induced Cyclization of Oligonaphthylehes", *Chem. Ber.*, 1992, 125, 2325-2330.
Nozaki et al., "The Double N-Arylation of Primary Amines: Toward Multisubstituted Carbazones with Unique Optical Properties", *Agnew. Chem. Int. Ed.*, 2003, 42, 2051-2053.
Fanta, "The Ullmann Synthesis of Biaryls", 1945-1963, *Department of Chemistry, Illinois Institute of Technology, Chicago 16, Illinois*, Received May 16, 1964.
Fanta, "The Ullman Synthesis of Biaryls", *Department of Chemistry, University of Rochester, Rochester, NY*, Received Aug. 10, 1945.
Goshaev et al., "The Ullmann Reaction", *Russian Chemical Reviews*, 41 (12), 1972, U.D.C. 547.223, pp. 1046-1059.
Zheng et al., "A Binaphthyl-Based Conjugated Polymer for Light-Emitting Diodes", *Chem. Mater.* 2000, 12, 13-15.
Pu, "Novel Chiral Conjugated Macromolecules for Potential Electrical and Optical Applications", *Macromol. Rapid Comm.*, 21, 795-809 (2000).

* cited by examiner

BLUE EMITTERS FOR USE IN ORGANIC ELECTROLUMINESCENCE DEVICES

BACKGROUND

This disclosure relates to organic light emitting devices (OLEDs), and finds particular application in conjunction with display devices utilizing electroluminescence technology.

Disclosed herein are organic electroluminescent (EL) devices and, more specifically, organic EL devices with a number of excellent performance characteristics inclusive of the enablement of blue emitting EL devices. These devices contain luminescent components or a luminescent component with excellent high thermal stability, film forming characteristics and intense blue fluorescence. Organic EL devices are desired that are capable of providing uniform luminescence, saturated color especially in the blue regions of the visible spectrum, and low driving voltages. The organic EL devices disclosed herein enable the above characteristics. These devices contain organic luminescent materials or light emitting components comprised of fluorescent 1,1'-binaphthyl derivatives. These devices can be selected for use in flat-panel emissive display technologies, including TV screens, computer screens, and the like.

A simple organic EL device can be comprised of a layer of an organic luminescent material conductively sandwiched between an anode, typically comprised of a transparent conductor, such as indium tin oxide, and a cathode, such as low work function metal like magnesium, calcium, aluminum, or the alloys thereof with other metals. The EL device functions on the principle that under an electric field, positive charges (holes) and negative charges (electrons) are respectively injected from the anode and cathode into the luminescent layer and undergo recombination to form excitonic states which subsequently emit light.

A number of conventional organic EL devices have been prepared from a laminate of an organic luminescent material and electrodes of opposite polarity. These devices include a single crystal material, such as single crystal anthracene, as the luminescent substance as described, for example, in U.S. Pat. No. 3,530,325. However, these devices require excitation voltages on the order of 100 volts or greater. Subsequent modifications of this organic EL device structure through incorporation of additional layers, such as certain charge injecting and charge transporting layers, may result in performance improvements.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Another alternate device configuration is comprised of three separate layers, a hole transport layer, a luminescent layer, and an electron transport layer, which layers are laminated in sequence and are sandwiched between an anode and a cathode. Optionally, a fluorescent dopant material can be added to the emission zone or layer whereby the recombination of charges results in the excitation of the fluorescent material.

In U.S. Pat. No. 4,539,507 there is disclosed an EL device formed of a conductive glass transparent anode, a hole transporting layer of 1,1-bis(4-p-tolylaminophenyl)cyclohexane, an electron transporting layer of 4,4'-bis(5,7-di-tert-pentyl-2-benzoxzolyl)stilbene, and an indium cathode.

U.S. Pat. No. 4,720,432 discloses an organic EL device comprising a dual-layer hole injecting and transporting zone, one layer being comprised of porphyrinic compounds supporting hole injection and the other layer being comprised of aromatic tertiary amine compounds supporting hole transport.

U.S. Pat. No. 4,769,292 discloses an EL device employing a luminescent zone comprised of an organic host material capable of sustaining hole-electron recombination and a fluorescent dye material capable of emitting light in response to energy released by hole-electron recombination. A preferred host material is an aluminum complex of 8-hydroxyquinoline, namely tris(8-hydroxyquinolinate)aluminum.

While recent progress in organic EL research has elevated the potential of organic EL devices for widespread applications, the performance levels of current available devices, especially with respect to blue emission, may still be below expectations. Further, for visual display applications, organic luminescent materials should provide a satisfactory color in the visible spectrum, normally with emission maxima at about 460, 550 and 630 nanometers (nm) for blue, green and red. Alternatively, organic EL devices may comprise a light-emitting layer which is comprised of a host material doped with a guest fluorescent material that is responsible for color emission. For efficient down-shifting of EL emission wavelength in the host-guest emitting layer, it is highly desirable that the host material should fluorescence in the blue or shorter wavelength region.

In most conventional organic EL devices, the luminescent zone or layer is formed of a green-emitting luminophor of tris(8-hydroxyquinolinate)aluminum with certain fluorescent materials. U.S. Pat. No. 5,409,783 further discloses a red-emitting organic EL device by doping the tris(8-hydroxyquinolinate)aluminum layer with a red fluorescent dye. However, up-shifting of the tris(8-hydroxyquinolinate)aluminum emission to blue region is believed to be highly inefficient. Although there have been several disclosures describing blue-emitting organic EL devices, for example in U.S. Pat. Nos. 5,151,629 and 5,516,577, their performance characteristics still possess many disadvantages such as poor emission hue, high operation voltages, low luminance, and poor operation stability.

Accordingly, there continues to be a need for improved luminescent compositions for organic EL devices, which may be vacuum evaporable and form thin films with excellent thermal stability. There is also a need for luminescent compositions which are capable of providing uniform and satisfactory emission in the blue region of the light spectrum. In particular, there is a need for efficient blue luminescent materials for organic EL devices, which may optionally be doped with a fluorescent or phosphorescent dye. Further there is also a need for luminescent compositions which can enhance the charge transporting characteristics, thus lowering device driving voltages.

Therefore, a primary feature of the present disclosure is to provide new luminescent materials comprised of certain fluorescent 1,1'-binaphthyl derivatives which can provide improved and excellent emission characteristics particularly in the blue region, such as a saturated blue color and a narrow emission spectrum.

The present exemplary embodiments contemplate a new class of blue light emitting materials which overcomes the above-referenced problems and others.

BRIEF DESCRIPTION

It is a feature of the present development to provide new luminescent compositions for organic EL devices.

The present disclosure relates to a new class of blue emitting materials comprised of 1,1'-binaphthyl derivatives for use in OLED devices which will offer many advantages such as low operation voltages, uniform light emission with spectrum spreading from blue to longer wavelengths, thermal stability, electrochemical stability, and charge transport capability.

In another feature of the present disclosure to provide organic EL devices with a light emitting layer containing a luminescent material comprised of a novel fluorescent 1,1'-binaphthyl derivative compound.

Further, an additional feature of the present disclosure concerns organic EL devices comprised of a supporting substrate of, for example, glass, an anode, an optional buffer layer, a vacuum deposited organic hole transporting layer comprised of, tertiary aromatic amines, for example, N,N'-1-naphthyl-N,N'-diphenyl-1,1'-biphenyl-4,4'-diamine, a vacuum deposited light emitting layer comprised of a luminescent 1,1'-binaphthyl derivative, an optional vacuum deposited electron transporting layer, and in contact there with a low work function metal, such as magnesium, lithium, and their alloys as a cathode.

Yet another feature of the disclosure relates to an organic EL device comprised of a supporting substrate of, for example, glass, an anode, an optional buffer layer, a vacuum deposited organic hole transporting layer comprised of tertiary aromatic amines, for example, N,N'-1-naphthyl-N,N'-diphenyl-1,1'-biphenyl-4,4'-diamine, a vacuum deposited light emitting layer, an optional vacuum deposited electron transporting layer, and in contact therewith a low work function metal, such as magnesium and its alloys as a cathode, wherein the light emitting layer is comprised of a mixture of a novel 1,1'-binaphthyl derivative as a host component and an optional fluorescent or phosphorescent material.

These and the other features of the development disclosed herein are accomplished by the provision of luminescent or light emitting components comprised of the 1,1'-binaphthyl derivatives illustrated by the Formula (I)

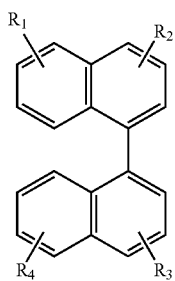

(Formula I)

wherein $R_1$, $R_2$, $R_3$ and $R_4$ are individual substituents or a group of substituents, each of which may be selected from the group consisting of hydrogen; or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like.

The luminescent or light emitting 1,1'-binaphthyl derivatives illustrated herein possess in embodiment several advantages. For example, these compounds exhibit strong fluorescence in the solid state in the region of from about 400 nanometers to longer wavelengths of, for example, about 600 nanometers; they have the ability of forming thin films with excellent thermal stability by vacuum evaporation; they are stable; and they can also be blended with a broad scope of fluorescent or phosphorescent materials to form a common phase.

A preferred structure for a light emitting component comprised of a 1,1'-binaphthyl derivative with excellent color purity could be illustrated by Formula (II). This type of compound will allow color tuning by the addition of further conjugation at the 4 and 4' positions.

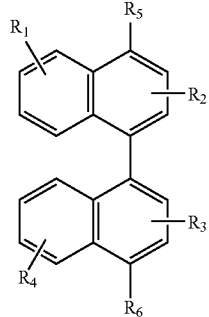

(Formula II)

In Formula (II), $R_1$, $R_2$, $R_3$ and $R_4$ are individual substituents or a group of substituents, each of which may be selected from the group consisting of hydrogen; or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like. $R_5$ and $R_6$ are substituents from the group consisting of an aryl or substituted aryl with about 6 to about 30 carbon atoms; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; carbon atoms from 4 to 24 necessary to complete a fused aromatic ring of naphthalene, anthracene, perylene and the like; and a silicon atom which can be substituted with a trimethyl, diphenylmethyl, triphenyl group and the like.

A preferred structure for a light emitting component comprised of a 1,1'-binaphthyl derivative with good amorphous properties could be illustrated by Formula (III). These types of compounds will form excellent thin films since the addition of groups at the 2 and 2' positions will minimize crystal packing and molecular aggregation within the device.

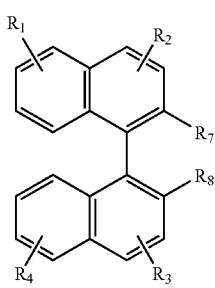

(Formula III)

In Formula (III), $R_1$, $R_2$, $R_3$ and $R_4$ are individual substituents or a group of substituents, each of which may be selected from the group consisting of hydrogen; or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like. $R_7$ and $R_8$ are substituents from the group consisting of alkyl of from 1 to about 25 carbon atoms; an alkoxy, amino, alkyl amino or aryl amino of from 1 to about 25 carbon atoms; a halogen, a cyano group, and the like.

Another preferred structure for a light emitting component comprised of a 1,1'-binaphthyl derivative would combine the features of compounds of Formula (II) and Formula (III) as illustrated in Formula (IV):

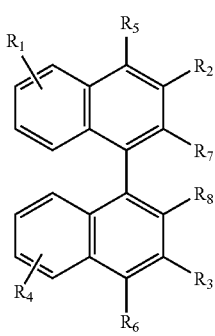

(Formula IV)

In Formula (IV), $R_1$, $R_2$, $R_3$ and $R_4$ are individual substituents or a group of substituents, each of which may be selected from the group consisting of hydrogen; or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like. $R_5$ and $R_6$ are substituents from the group consisting of an aryl or substituted aryl with about 6 to about 30 carbon atoms; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; carbon atoms from 4 to 24 necessary to complete a fused aromatic ring of naphthalene, anthracene, perylene and the like; a silicon atom which can be substituted with a trimethyl, diphenylmethyl, triphenyl group and the like. $R_7$ and $R_8$ are substituents from the group consisting of alkyl of from 1 to about 25 carbon atoms; an alkoxy, amino, alkyl amino or aryl amino of from 1 to about 25 carbon atoms; a halogen, a cyano group, and the like.

In certain embodiments, this disclosure relates to organic EL devices that are comprised in the following order of a supporting substrate of, for example, glass, an anode, an optional buffer layer, an organic hole transporting layer, an organic light emitting 1,1'-binaphthyl derivatives layer, and an optional electron transporting layer, and in contact therewith a low work function metal as a cathode, wherein the light emitting layer contains at least one luminescent 1,1'-binaphthyl derivative illustrated and encompassed by the formulas recited herein, for example Formula (I); and layered EL devices with a light emitting layer comprised of a luminescent composition comprised of a 1,1'-binaphthyl derivative illustrated by, for example, Formula (I) as a host component capable of sustaining hole-electron recombination and a guest fluorescent or phosphorescent material capable of emitting light in response to energy released by the hole-electron recombination. The light emitting layer may be formed by vacuum deposition from evaporation of the fluorescent 1,1'-binapthyl derivative, and wherein the presence of the fluorescent material, permits a wide latitude of wavelengths of light emission and may enable the enhancement of electroluminescent efficiency and improvements in device operation stability.

Another advantage of the disclosure is the provision of a blue emitting material that is particularly well suited for use in an OLED.

Still further advantages and benefits of the disclosure will become apparent to those of ordinary skill in the art upon reading and understanding the following detailed description of the preferred embodiments.

BRIEF DESCRIPTION OF THE DRAWINGS

The exemplary embodiments of the disclosure may take form in various components and arrangements of components, and in various steps and arrangements of steps. The drawings are only for purposes of illustrating preferred embodiments and are not to be construed as limiting the exemplary embodiment.

DETAILED DESCRIPTION

Before describing the exemplary embodiment blue light emitting materials of this disclosure and OLED's utilizing these materials, it is instructive to note prior Xerox patents that provide extensive description as to details of this technology. Representative patents include, but are not limited to, U.S. Pat. Nos. 4,583,848; 5,607,876; 5,763,110; 5,846,666; 5,925,472; 5,932,363; 5,942,340; 5,952,115; 6,137,523; 6,479,172; and Japan Patent Abstracts Publication Nos. 10-319872 and 11-020235; all of which are hereby fully incorporated by reference.

Figure 1:
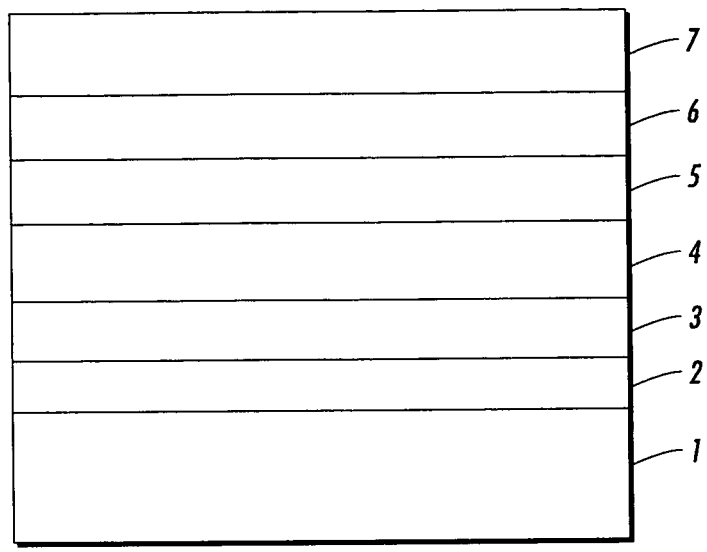
FIG. 1 shows a schematic diagram of the multi-layer structure of the preferred EL devices.
Figure 2:
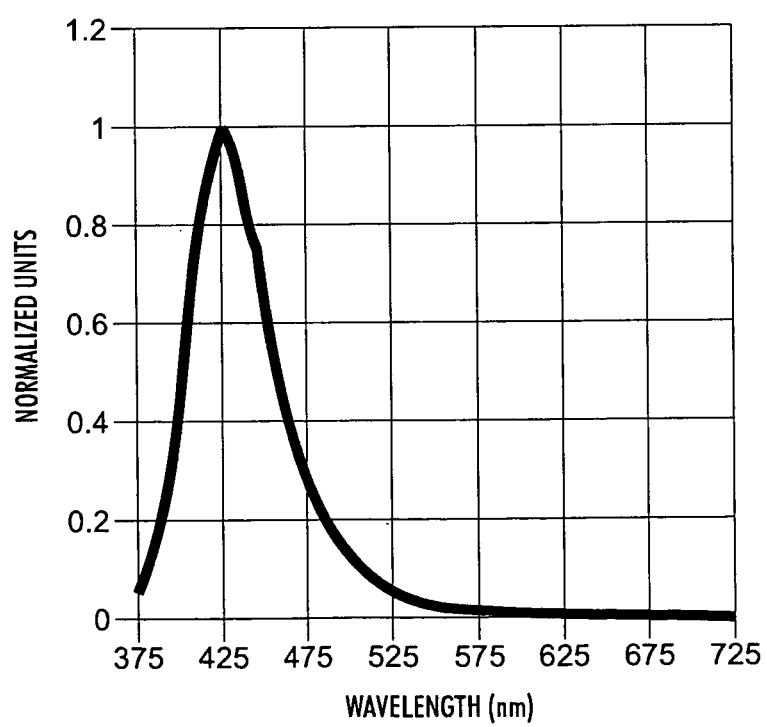
FIG. 2 illustrates the spectral characteristic of an EL device described in Example V.
Figure 3:
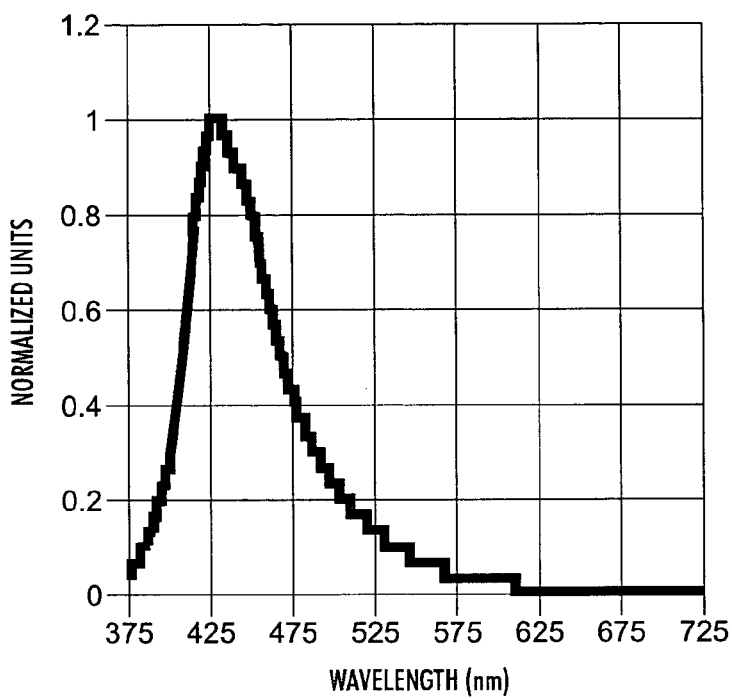
FIG. 3 illustrates the spectral characteristic of an EL device described in Example VI.
Figure 4:
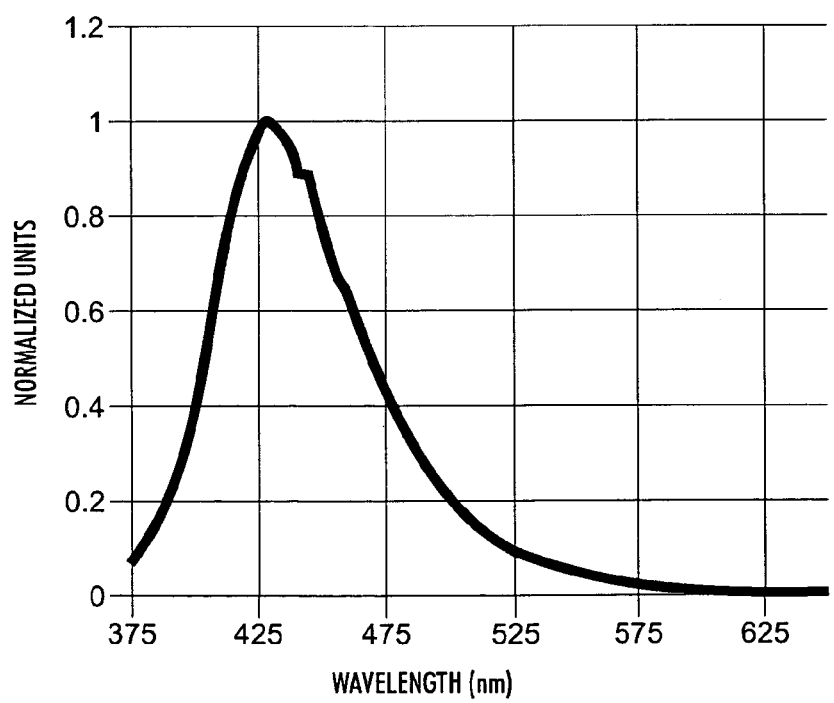
FIG. 4 illustrates the spectral characteristics of an EL device described in Example VII.
Figure 5:
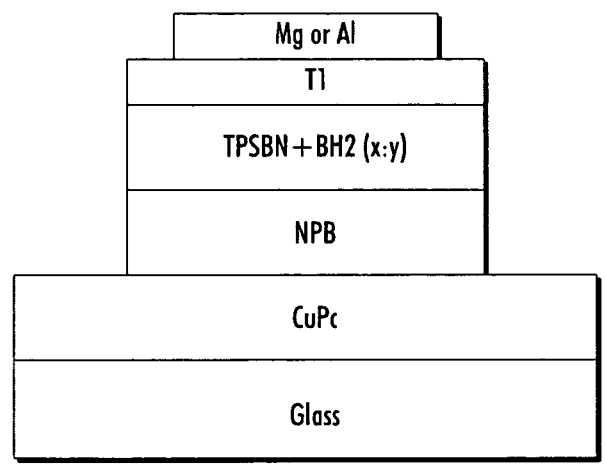
Figure 6:
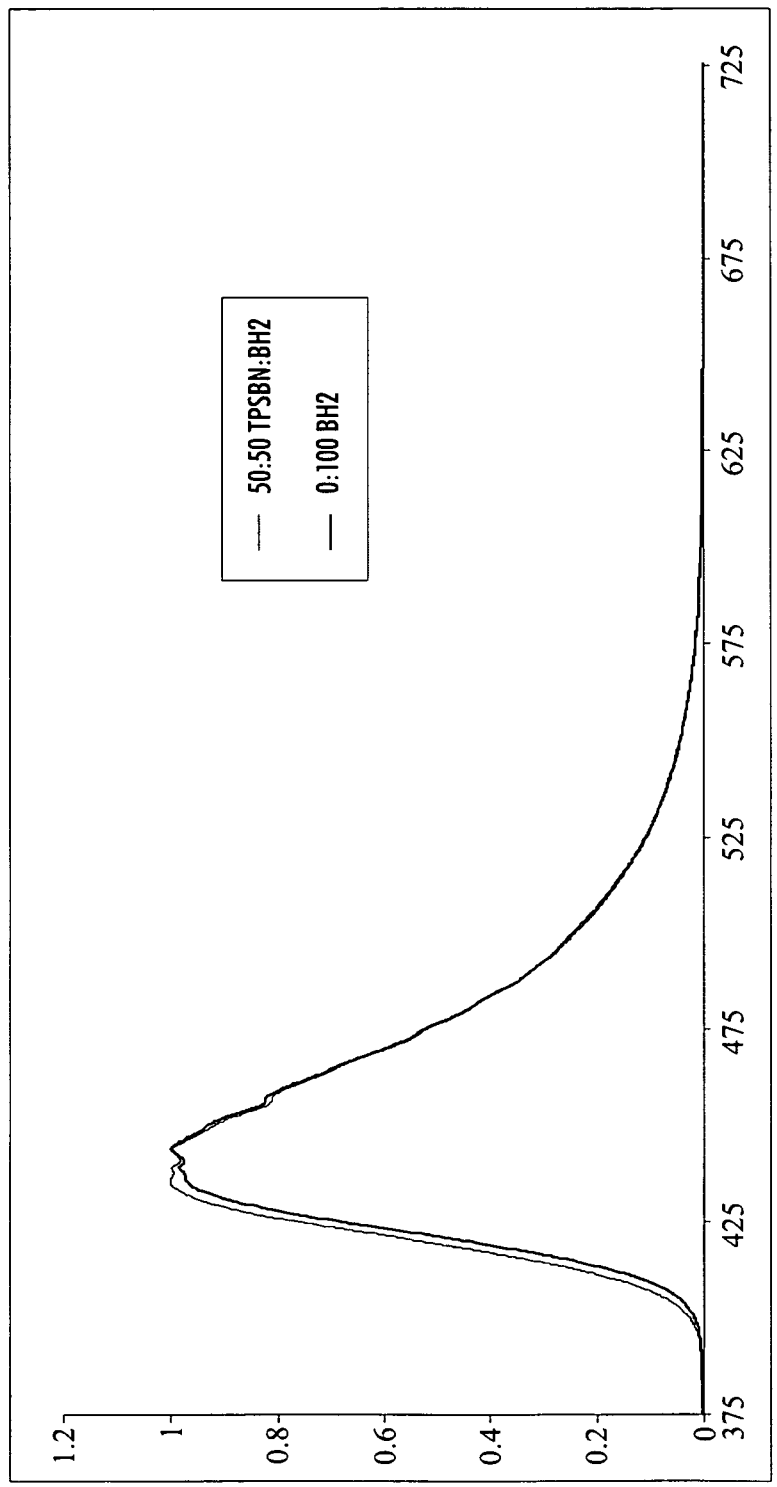

Embodiments of the disclosure will be described in more detail with reference to the following schematic diagrams of EL devices as illustrated in FIG. 1.

FIG. 1 illustrates an EL device or an organic light emitting diode which is comprised of a supporting substrate 1 of, for example, glass, an anode 2 of for example indium tin oxide in a thickness of from about 1 to about 100 nanometers and preferably from about 10 to about 80 nanometers (throughout the thickness ranges for each layer are examples and other suitable thickness may be selected), optionally a buffer layer 3 of, for example, copper (II) phthalocyanine in a thickness from about 5 to about 80 nanometers and preferably from about 10 to about 40 nanometers, an organic hole transporting layer 4 of an aromatic amine compound, for example, N,N'-1-naphthyl-N,N'-diphenyl-1,1'-biphenyl-4,4'-diamine in a thickness of from about 1 to about 100 nanometers and preferably from about 5 to about 80 nanometers; an organic light emitting layer 5 comprised of a luminescent 1,1'-binaphthyl derivative of the formulas or encompassed by the formulas illustrated herein in a thickness of from about 1 to about 100 nanometers and preferably from about 20 to about 80 nanometers, an organic electron transporting layer or hole blocking layer 6 of, for example, 4,4'-bis-[2-(4,6-diphenyl-1,3,5-triazinyl)]-1,1'-biphenyl or tris-(8-hydroxyquinolinato)aluminum, in a thickness of from about 1 to about 300 nanometers and preferably from about 10 to about 80 nanometers, and in contact therewith a low work function metal as a cathode 6. In this EL device, a junction is formed between the hole transporting layer and the light emitting layer. In operation, when the anode is electrically biased to a positive potential with respect to the cathode, holes are injected into the organic hole transporting layer and transported across this layer to the junction. Concurrently, electrons are injected from the cathode to the electron transport layer and are transported toward the same junction. Recombination of holes and electrons occurs near the junction, resulting in light emission. Optionally, the light emitting layer contains more than one luminescent material, one of which is a luminescent 1,1'-binaphthyl derivative illustrated and encompassed by the Formula (I) which can act as a host component capable of sustaining hole-electron recombination or as a guest fluorescent or phosphorescent material capable of emitting light in response to energy released by the hole-electron recombination.

In aspects thereof, the present disclosure relates to an organic electroluminescent device comprised of an anode and a cathode, and an EL element positioned between the anode and the cathode, wherein said EL element has at least a light emitting layer containing a luminescent 1,1'-binaphthyl derivative comprised of the Formula (I):

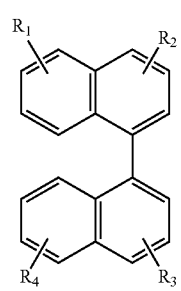

(Formula I)

wherein $R_1$, $R_2$, $R_3$ and $R_4$ are individual substituents or a group of substituents, each of which may be selected from the group consisting of hydrogen, or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like.

Illustrative examples of the 1,1'-binaphthyl derivatives described by Formula (I) include the following compounds:

Compound 1

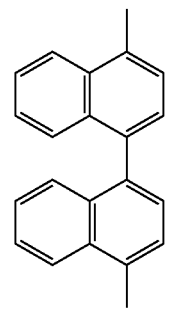

Compound 2

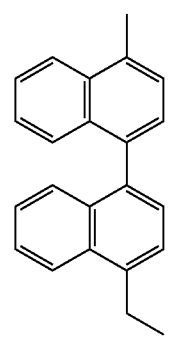

Compound 3
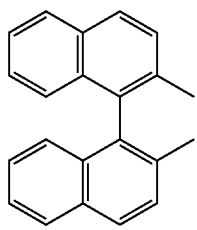
Compound 4
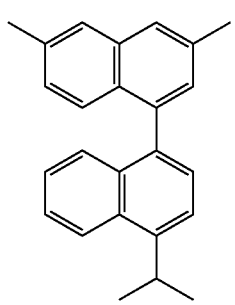
Compound 5
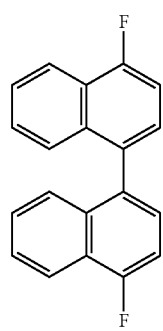
Compound 6
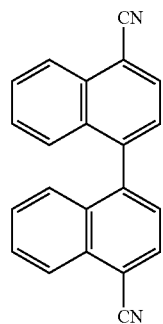
Compound 7
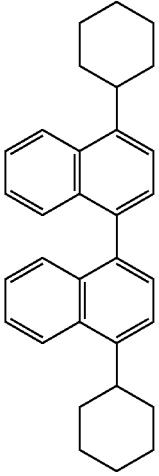
Compound 8
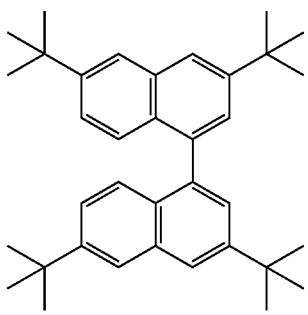
Compound 9
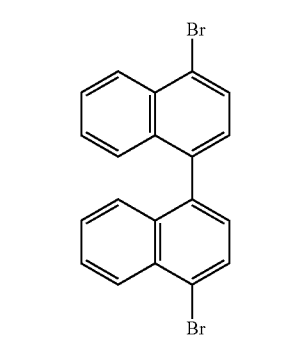
Compound 10
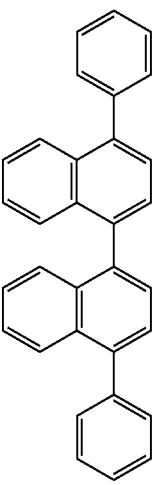

Compound 11
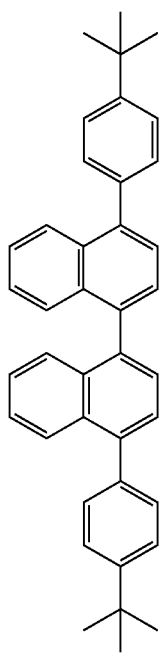
Compound 12
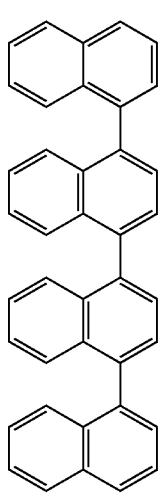
Compound 13
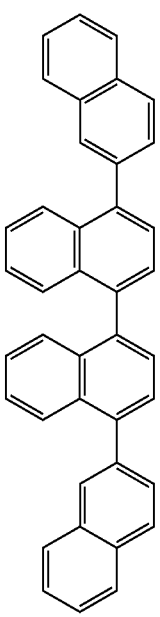
Compound 14
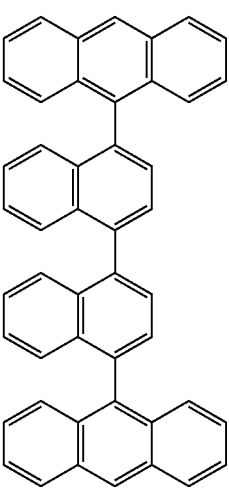

Compound 15
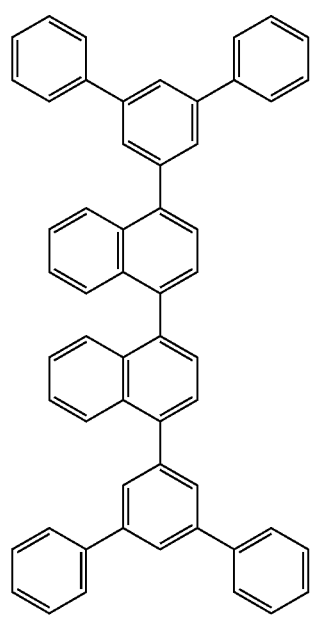
Compound 16
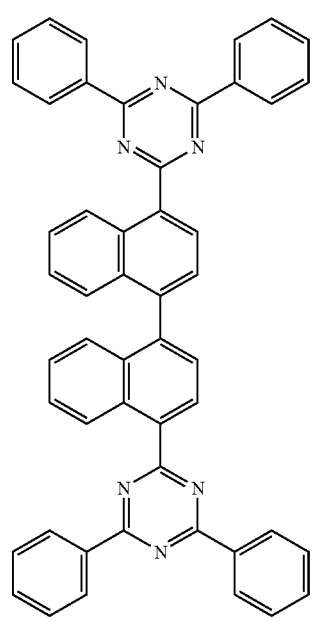
Compound 17
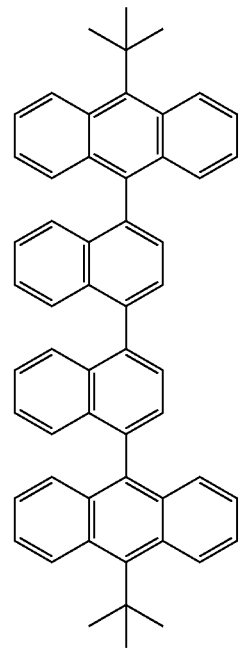
Compound 18
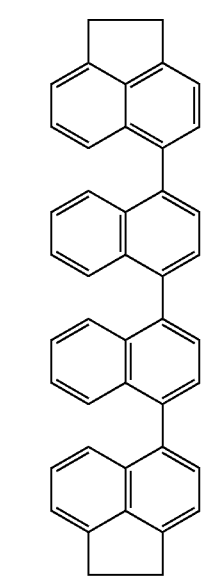

Compound 19
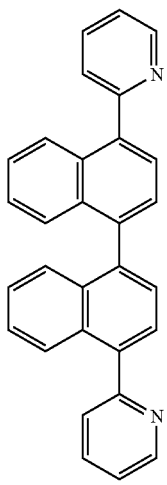
Compound 20
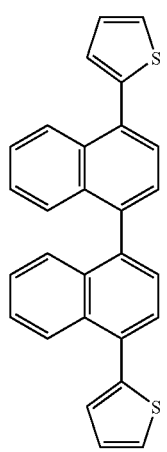
Compound 21
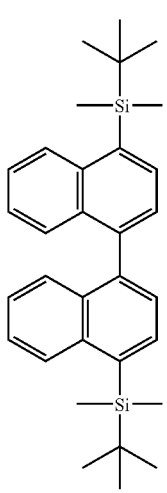
Compound 22
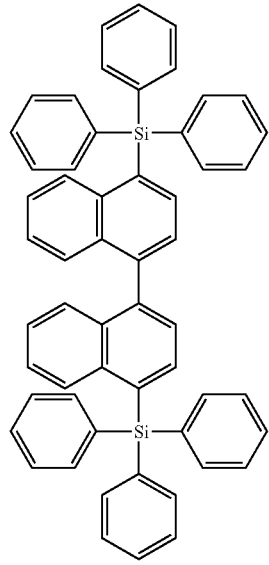
Compound 23
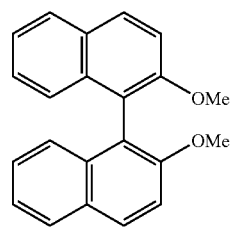
Compound 24
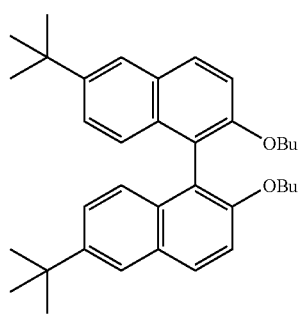
Compound 25

Compound 26

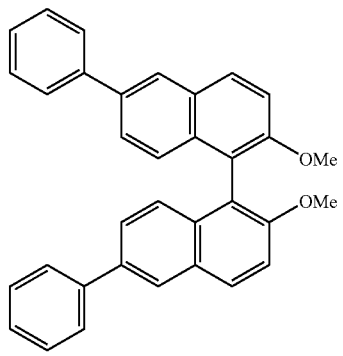

Compound 27

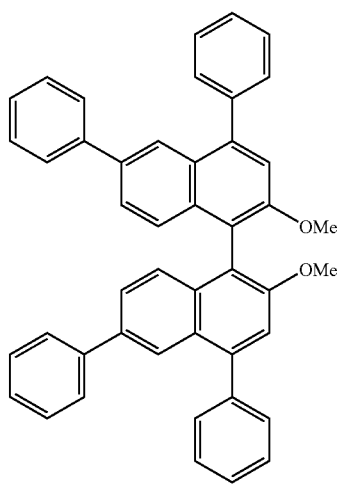

Compound 28

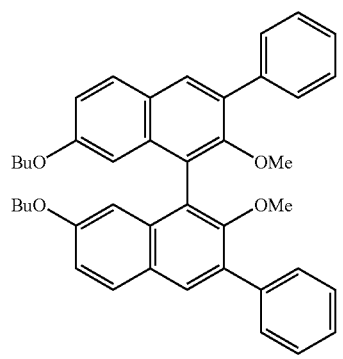

A preferred structure for a light emitting component comprised of a 1,1'-binaphthyl derivative with excellent color purity could be illustrated by Formula (II). This type of compound will allow color tuning by the addition of further conjugation at the 4 and 4' positions.

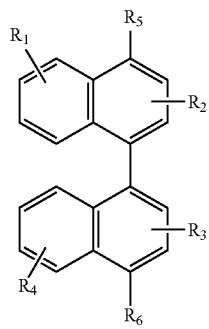

(Formula II)

In Formula (II), $R_1$, $R_2$, $R_3$ and $R_4$ are individual substituents or a group of substituents, each of which may be selected from the group consisting of hydrogen, or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like. $R_5$ and $R_6$ are substituents from the group consisting of an aryl or substituted aryl with about 6 to about 30 carbon atoms; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; carbon atoms from 4 to 24 necessary to complete a fused aromatic ring of naphthalene, anthracene, perylene and the like; a silicon atom which can be substituted with a trimethyl, diphenylmethyl, triphenyl group and the like.

Illustrative examples of the 1,1'-binaphthyl derivatives described by Formula (II) include the following compounds:

Compound 10

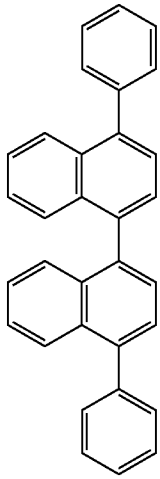

Compound 11

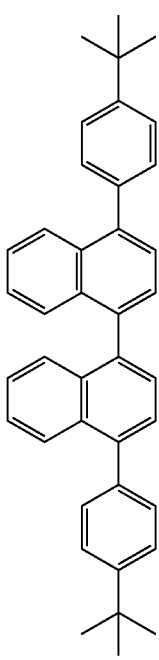

Compound 13

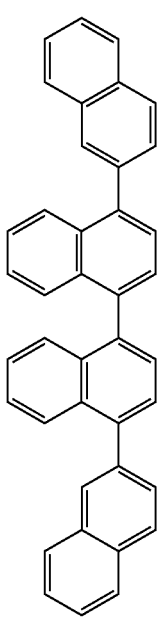

Compound 19

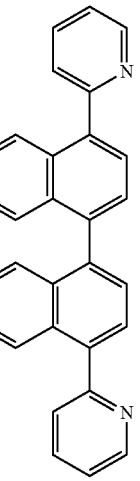

Compound 20

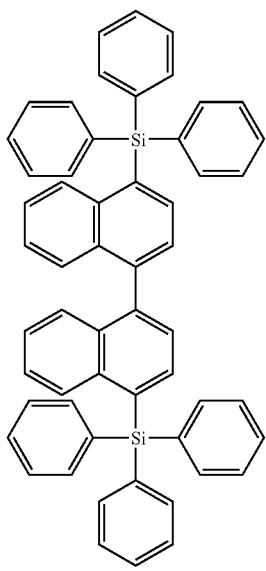

A preferred structure for a light emitting component comprised of a 1,1'-binaphthyl derivative with good amorphous properties could be illustrated by Formula (III). These types of compounds will form excellent thin films since the addition of groups at the 2 and 2' positions will minimize crystal packing and aggregation within the device.

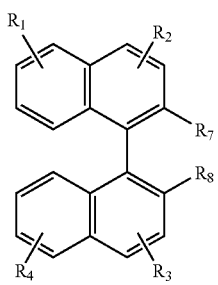

(Formula III)

In Formula (III), $R_1$, $R_2$, $R_3$ and $R_4$ are individual substituents or a group of substituents, each of which may be selected from the group consisting of hydrogen, or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like. $R_7$ and $R_8$ are substituents from the group consisting of alkyl of from 1 to about 25 carbon atoms; an alkoxy, amino, alkyl amino or aryl amino of from 1 to about 25 carbon atoms; a halogen, a cyano group, and the like.

Illustrative examples of the 1,1'-binaphthyl derivatives described by Formula (III) include the following compounds:

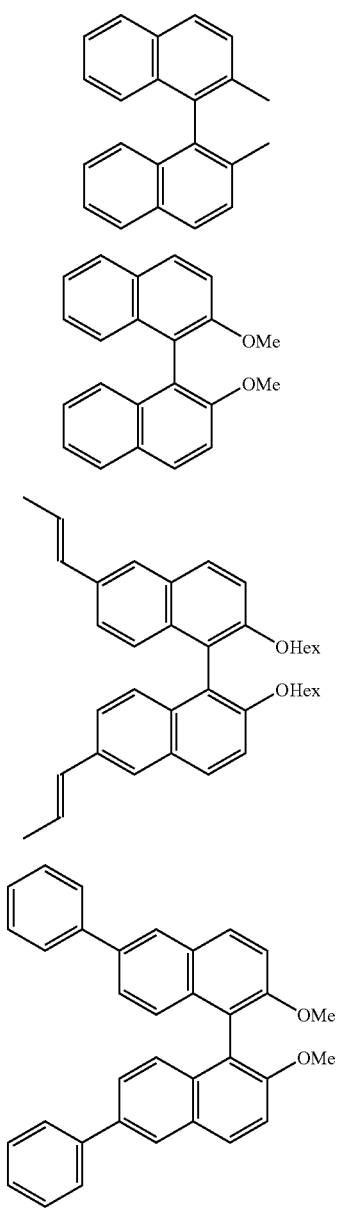

Compound 3

Compound 23

Compound 25

Compound 26

Another preferred structure for a light emitting component comprised of a 1,1'-binaphthyl derivative would combine the features of compounds of Formula (II) and Formula (III) as illustrated in Formula (IV):

(Formula IV)

In Formula (IV), $R_1$, $R_2$, $R_3$ and $R_4$ are individual substituents or a group of substituents, each of which may be selected from the group consisting of hydrogen, or alkyl of from 1 to about 25 carbon atoms; an alicyclic alkyl of from 3 to 15 carbon atoms; an aryl or substituted aryl with about 6 to about 30 carbon atoms; carbon atoms from 4 to 24 necessary to complete a fused aromatic ring of naphthalene, anthracene, perylene and the like; an alicyclic alkyl group with from about 3 to about 15 carbon atoms; a silicon atom which can be substituted with a trimethyl, diphenylmethyl, triphenyl group and the like; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; an alkoxy, amino, alkyl amino or aryl amino of from 1 to about 25 carbon atoms; a halogen, a cyano group, and the like. $R_5$ and $R_6$ are substituents from the group consisting of an aryl or substituted aryl with about 6 to about 30 carbon atoms; heteroaryl or substituted heteroaryl of from 5 to 24 carbon atoms, carbon atoms necessary to complete a fused heteroaromatic ring of furyl, thienyl, pyridyl, quinolinyl and other heterocyclic systems; carbon atoms from 4 to 24 necessary to complete a fused aromatic ring of naphthalene, anthracene, perylene and the like; a silicon atom which can be substituted with a trimethyl, diphenylmethyl, triphenyl group and the like. $R_7$ and $R_8$ are substituents from the group consisting of alkyl of from 1 to about 25 carbon atoms; an alkoxy, amino, alkyl amino or aryl amino of from 1 to about 25 carbon atoms; a halogen, a cyano group, and the like.

Illustrative examples of the 1,1'-binaphthyl derivatives described by Formula (III) include the following compound:

Compound 27

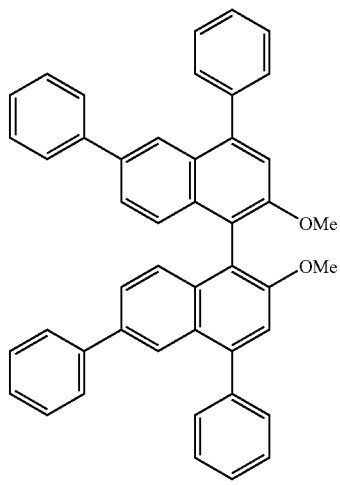

The 1,1'-binaphthyl derivatives described herein may be obtained by standard synthetic processes. The compound, 1,1'-binaphthyl itself can be prepared through the Ullmann reaction by the coupling of the desired halogenated naphthalene in a solvent such as toluene, nitrobenzene, DMF or DMSO and the like in the presence of a copper catalyst such as copper bronze at reflux temperature. Compounds such as 1-8 could be prepared in this way. The Ullmann reaction is well known in the literature. See, for example, Fanta, *Chem. Rev.*, 64 (no 6), 1964, Fanta, *Chem. Rev.*, 38 (no 1), 1946, Goshaev et al., *Russian Chemical Reviews*, 41 (12), 1972, all of which are hereby incorporated by reference.

Compound 9 could be prepared by bromination of 1,1'-binaphthyl by addition of bromine to 1,1'-binaphthyl in dichloromethane (example I) to produce 4,4'-dibromo-1,1'-binaphthyl which could than be reacted through a Suzuki reaction (examples II and III) to produce compounds such as compounds 10 to 20. The synthesis of compound 10 is described by Anton et al., *Chem. Ber.* 125, 1992, 2325-2330 which is hereby incorporated by reference. The compound, 4,4-dibromo-1,1'-binaphthyl could also be reacted with butyllithium and then with the desired substituted silyl chloride (example IV) to produce compounds such as compounds 21 to 22.

The compound, 1,1'-bi-2-naphthol is commercially available and can be utilized to prepare compounds such as compounds 23-28. The chemistry to prepare these types of compounds is well known in the literature. See, for example, Zheng et al., *Chem. Mater.* 12, 2000, 13-15; Ostrowski et al., *Chem. Eur. J.*, 20, 2001, 4500-4511; Benmansour et al., *Adv. Funct. Mater.* 13, no. 11, 2003, 883-886; Tian and Chan, *Tet. Lett.*, 41, 2000, 8813-8816; Pu, *Macromol. Rapid Commun.* 21, 2000, 795-809, all of which are hereby incorporated by reference.

The luminescent, 1,1'-binaphthyl derivatives described herein exhibit strong fluorescence in solid state in the region from about 400 nm to for example about 600 nm. They have the ability of forming thin films with excellent thermal stability by vacuum evaporation.

In embodiments, the light emitting layer 5 disclosed herein may further include a fluorescent or phosphorescent material, wherein said layer is formed of a luminescent composition comprised of a 1,1'-binaphthyl derivative illustrated by Formula (I) as a host component. By mixing the 1,1'-binaphthyl derivative host component and a small amount of a fluorescent or phosphorescent material capable of emitting light in response to hole-electron recombination, improved device performance characteristics, such as emission hue and electroluminescent efficiency, may be achieved. The fluorescent or phosphorescent material is present in an amount of, for example, from about 0.01 to about 10 weight percent, or from about 0.01 to about 10 mole percent, based on the moles of the 1,1'-binaphthyl derivative host material, and preferably from about 1 to about 5 weight percent of the host 1,1'-binaphthyl derivative component. Suitable fluorescent or phosphorescent material employed as the guest component are those possessing a bandgap no greater than that of said host component and a potential less negative than that of said host component. The fluorescent or phosphorescent materials described herein are capable of being blended with the host 1,1'-binaphthyl derivative material to form a common phase.

Illustrative examples of fluorescent materials are dyes selected for example, from the group consisting of coumarin, dicyanomethylene pyranes, polymethine, oxabenzanthrane, xanthene, pyrylium, carbostyl, perylene, and the like. Preferable examples of fluorescent materials include acridone dyes such as N-methyl-9-acridone, N-methyl-2-methoxy-9-acridone, N-methyl-2-phenoxy-9-acridone, N-methyl-2-t-butoxy-9-acridone, N-phenyl-2-methoxy-9-acridone, N-methyl-2-phenyl-9-acridone, N-methyl-2-diethylamino-9-acridone, and the like; and a dye selected from the group consisting of quinacridone derivatives. Illustrative examples of quinacridone dyes include of N,N'-dimethylquinacridone, N,N'-dimethyl-2-methyl quinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone, and the like. Also another preferred class of fluorescent materials are fused ring fluorescent dyes. Examples of the fused ring fluorescent dyes include perylene, tetra-t-butylperylene, rubrene, anthracene, coronene, phenanthrecene, pyrene and the like, as illustrated in U.S. Pat. No. 3,172,862, the disclosure of which is totally incorporated herein by reference. Also, fluorescent materials used as a dopant include butadienes, such as 1,4-diphenylbutadiene and tetraphenylbutadiene, and stilbenes, and the like as illustrated in U.S. Pat. Nos. 4,356,429 and 5,516,577, the disclosures of which are totally incorporated herein by reference.

Illustrative examples of phosphorescent materials are dyes selected for example, from the group consisting of organometallic compounds containing a heavy metal atom that can result in strong spin-orbit coupling, such as disclosed in Baldo et. al., "Highly efficient organic phosphorescent emission from organic electroluminescent devices", Letters to Nature, Volume 395, pp 151-154 (1998). Preferred examples include 2,3,7,8,12,13,17,18-octaethyl-21H,23H-phorpine platinum(II) (PtOEP) and others, such as, for example, those disclosed in U.S. Pat. No. 6,048,630, the disclosure of which is totally incorporated herein by reference, and fac tris(2-phenylpyridine)iridium (Ir(ppy)3).

The light emitting layer described herein may be formed by any convenient manners. For example, it can be prepared by vacuum deposition from the evaporation of the luminescent 1,1'-binapthyl derivative, or from the simultaneous evaporation of the 1,1'-binaphthyl derivative host material and the fluorescent or phosphorescent material. The thickness of the light emitting layer is not particularly limited, and can range from about 5 nanometers to about 300 nanometers, and preferably from about 10 nanometers to about 100 nanometers.

It is desirable that the organic EL devices of present development comprise a supporting substrate. Illustrative examples of the supporting substrate include polymeric components, glass and the like, and polyesters like MYLAR®, polycarbonates, polyacrylates, polymethacrylates, polysulfones, quartz, and the like. Other substrates can also be selected provided, for example, that the substrate can effectively support the other layers, and that it does not interfere with the device functional performance. The thickness of the substrate can be for example from about 25 to about 1,000 microns or more, and for example, from about 50 to about 500 microns depending for example on the structural demands of the device.

Examples of the anode which is contiguous to the substrate, include positive charge injecting electrodes such as indium tin oxide, tin oxide, gold, platinum, or other suitable materials such as electrically conductive carbon, conjugated polymers such as polyaniline, polypyrrole, and the like with, for example, a work function equal to, or greater than about 4 electron volts, and more specifically, from about 4 to about 6 electron volts. The thickness of the anode can range from about 1 to about 500 nanometers with the preferred range being dictated by the optical constants of the anode material. One preferred range of thickness is from about 30 to about 100 nanometers.

The buffer layer, for example layer 3 illustrated herein is optional, and which layer primarily functions to achieve desirable charge injection of holes from the anode, and to improve the adhesion between the anode and the organic hole transporting layer, thus further improving the device operation stability. Specific examples of buffer layer materials include conductive materials such as polyaniline and its acid-doped forms, polypyrrole, poly(phenylene vinylene), and known semiconductive organic materials; porphyrin derivatives disclosed in U.S. Pat. No. 4,356,429 such as 1,10,15,20-tetraphenyl-21H,23H-porphyrin copper (11); copper phthalocyanine, copper tetramethyl phthalocyanine; zinc phthalocyanine; titanium oxide phthalocyanine; magnesium phthalocyanine; and the like, the disclosures of each of these patents being totally incorporated herein by reference.

A class of hole transporting materials that can be selected for the buffer layer are the aromatic tertiary amines such as those disclosed in U.S. Pat. No. 4,539,507, the disclosure of which is totally incorporated herein by reference. Representative examples of aromatic tertiary amines are bis(4-dimethylamino-2-methylphenyl)phenylmethane, N,N,N-tri(p-tolyl)amine, 1,1-bis(4-di-p-tolylaminophenyl)cyclohexane, 1,1 bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, and the like. Another class of aromatic tertiary amines selected for the hole transporting layer is polynuclear aromatic amines, such as N,N-bis-[4'-(N-phenyl-N-m-tolylamino)-4-biphenylyl]aniline; N,N-bis-[4'-(N-phenyl-N-m-tolylamino)-4-biphenyly]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene and the like.

The buffer layer 3 can be prepared by forming one of the above compounds into thin film by known methods, such as vapor deposition or spin-coating. The thickness of buffer layer thus formed is not particularly limited, and can be in a range of from about 5 nanometers to about 300 nanometers, and preferably from about 10 nanometers to about 100 nanometers.

The hole transporting layers, such as layer 4 of FIG. 1 can be comprised of a hole transporting material with a thickness ranging from about 1 nanometers to about 200 nanometers, and preferably from about 5 nanometers to 100 nanometers. This layer can reduce the driving voltage of the device and improve the confinement of the injected charge recombination within the light emitting layer. Any conventional suitable aromatic amine hole transporting materials described for the buffer layer may be selected for forming this layer.

A preferred class of hole transporting materials selected for forming the hole transporting layer is comprised of N,N,N',N'-tetraarylbenzidine derivatives. Illustrative examples of benzidine derivatives include N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-1-naphthyl-N,N'-diphenyl-1,1'-biphenyl-4,4'-diamine and the like.

The electron transporting layer 6 is not necessarily required for the present device, but is optionally and preferably used for the primary purpose of improving the electron injection characteristics of the EL devices and the emission uniformity. The thickness of this layer can be from about 1 nanometers to about 300 nanometers, and preferably from about 5 nanometers to about 100 nanometers. Illustrative examples of electron transporting compounds, which can be utilized in this layer, include the metal chelates of 8-hydroxyquinoline as disclosed in U.S. Pat. Nos. 4,539,507, 5,151, 629, and 5,150,006, the disclosures of which are totally incorporated herein by reference. Illustrative examples include tris(8-hydroxyquinolinate) aluminum, a preferred one, tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato)aluminum, bis[benzo{f}-8-quinolinate]zinc, bis(10-hydroxybenzo[h]quinolinate) beryllium, and the like. Another class of metal chelate compounds for electron transport layer are the oxadiazole metal chelates disclosed in U.S. Pat. No. 5,925,472, the disclosure of which is totally incorporated herein by reference.

Another class of electron transport materials, which can be utilized in this layer, comprises triazine compounds as disclosed in U.S. Pat. No. 6,225,467 the disclosure of which is totally incorporated herein by reference. Illustrative examples include 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-anisyl-1,3,5-triazinyl)]-1,1'-biphenyl, 4,4'-bis-[2-(4-naphthyl-6-phenyl-1,3,5-triazinyl)]-1,1'-biphenyl, 4,4'-bis-[2-(4,6-di-biphenylyl-1,3,5-triazinyl)]-1,1'-biphenyl, 4,4'-bis-[2-(4,6-di-phenyl-1,3,5-triazinyl)]-2,2'-dimethyl-1,1'-biphenyl, 4,4'-bis-[2-(4,6-di-phenyl-1,3,5-triazinyl)]-stilbene, 4,4'-bis-[2-(4-phenyl-6-p-tolyl-1,3,5-triazinyl)]-stilbene, 2,4,6-tri(4-biphenylyl)-1,3,5-triazine, and the like.

The cathode 6 can be comprised of any metal, including high, for example from about 4.0 eV to about 6.0 eV, or low work function component, such as metals with for example, an eV of from about 2.5 eV to about 4.0 eV (electron volts). The cathode can be derived from a combination of a low work function metal (less than about 4 eV) and at least one other metal. Effective proportions of the low work function metal to the second or other metal are from less than about 0.1 percent to about 99.9 percent by weight. Illustrative examples of low work function metals include alkaline metals such as lithium or sodium, Group 2A or alkaline earth metals such as beryllium, magnesium, calcium, or barium, and Group III metals including rare earth metals and the actinide group metals such as scandium, yttrium, lanthanum, cerium, europium, terbium, or actinium. Lithium, magnesium and calcium are preferred low work function metals.

The thickness of cathode 6 ranges from for example about 10 nanometers to about 500 nanometers. The Mg:Ag cathodes of U.S. Pat. No. 4,885,211, the disclosure of which constitute one preferred cathode construction. Another preferred cathode construction is described in U.S. Pat. No. 5,429,884, the disclosure of which are totally incorporated herein by reference, wherein the cathodes are formed from lithium alloys with other high work function metals such as aluminum and indium.

Both anode 3 and cathode 6 of the EL devices of the present disclosure may contain a protective coating thereon, and the anode and cathode can be of any convenient forms. A thin conductive layer can be coated onto a light transmissive substrate, for example, a transparent or substantially transparent glass plate or plastic film. The EL device can include a light transmissive anode 3 formed from tin oxide or indium tin oxide coated on a glass plate. Also, very thin, for example less than about 200 Å, and more specifically, from about 75 to about 150 Angstroms, light-transparent metallic anodes can be used, such as gold, palladium, and the like. In addition, transparent or semitransparent thin layers, for example from 50 to about 175 Angstroms of conductive carbon or conjugated polymers such as polyaniline, polypyrrole, and the like can be used as anodes. Any light transmissive polymeric film can be employed as the substrate. Additional suitable forms of the anode 3 and cathode 6 are illustrated in U.S. Pat. No. 4,885,211.

The following examples are provided to further illustrate various species of the present development, it being noted that these examples are intended to illustrate and not limit the scope of the present disclosure; mL refers to milliliters, and g refers to grams.

EXAMPLES

More detailed description of examples of the disclosure will be given in the following examples, which are not intended to restrict the scope of the development.

Example I

Synthesis of 4,4'-dibromo-1,1'-binaphthyl (Compound 9)

The compound, 1,1'-binaphthyl (10 g) was placed into a 1 L 3-necked flask equipped with a drying tube and addition funnel. The 1,1'-binaphthyl was dissolved in 600 mL of dichloromethane and was cooled to 0° C. on an ice bath. The bromine (4.25 mL) was placed into the addition funnel and diluted with 50 mL of dichloromethane. The bromine solution was added slowly to the reaction. The reaction was stirred for 3 hours and then a saturated aqueous solution of sodium thiosulfate (200 mL) was added which was stirred vigorously for 1 hour. The organic layer was removed and the aqueous layer was extracted with 2×200 mL of dichloromethane. The organic layers were collected, dried and the solvent removed under reduced pressure to give a brown powder which was treated with a 50/50 mixture of filtrol and alumina in toluene. The mixture was filtered and the solvent was removed under reduced pressure to give 15.3 g of a white powder. This compound and its structure was confirmed by proton NMR analysis.

Example II

Synthesis of 4,4'-[(4-t-butyl)diphenyl]-1,1'-binaphthyl (Compound 11)

The 4,4'-dibromo-1,1'-binaphthyl (5 g) and 4-t-butylphenyl boronic acid (3.3 g) were dissolved in toluene (75 mL) and ethanol (15 mL) under argon. A 2.0M aqueous potassium carbonate solution was added (22 mL) and the solution was purged with argon. The tetrakis(triphenylphosphine)palladium(0) (0.45 g) was added and the mixture was heated at reflux for 48 hours. After cooling, the layers were separated and the organic layer was extracted with 5% HCl and then several times with water. The organic layer was collected, dried and the solvent removed under reduced pressure to give a yellow powder. The solid was purified by sublimation to yield 4.78 g of the desired compound which has a melting point of 270° C. The structure of this compound was confirmed by proton NMR.

Example III

Synthesis of 4,4'-(2-naphthyl)-1,1'-binaphthyl (Compound 13)

The 4,4'-dibromo-1,1'-binaphthyl (5 g) and 2-naphthalene boronic acid (4.6 g) were dissolved in toluene (75 mL) and ethanol (15 mL) under argon. A 2.0M aqueous potassium carbonate solution was added (22 mL) and the solution was purged with argon. The tetrakis(triphenylphosphine)palladium(0) (0.45 g) was added and the mixture was heated at reflux for 48 hours. After cooling, the layers were separated and the organic layer was extracted with 5% HCl and then several times with water. The organic layer was collected, dried and the solvent removed under reduced pressure to give a yellow powder. The solid was purified by sublimation to yield 4.25 g of the desired compound which has a melting point of 285° C. The structure of this compound was confirmed by proton NMR.

Example IV

Synthesis of 4,4'-triphenylsilyl-1,1'-binaphthyl (Compound 22)

The 4,4'-dibromo-1,1'-binaphthyl (5 g) was dissolved into anhydrous diethyl ether under argon. The reaction was cooled to −78° C. and n-butyllithium (13.34 mL, 2.0M in cyclohexane) was added slowly. The reaction was stirred for two hours while it warmed to room temperature. The triphenylsilyl chloride (7.8 g) was added to the reaction. The reaction was stirred at room temperature under argon overnight. The reaction was washed with a saturated aqueous sodium bicarbonate solution and then a saturated aqueous ammonium chloride solution. The organic layer was collected, dried the solvent removed under reduced pressure to give a yellow oil. The product was purified by silica gel chromatography (5% ethyl acetate/hexane) and then by sublimation to yield 5.86 g of the desired compound which has a melting point of 310° C. The structure of this compound was confirmed by proton NMR.

Example V

Organic EL devices comprising a light emitting layer of a fluorescent 1,1'-binaphthyl derivative of Formula (I) can be fabricated in the following manner:

1. A 500 Å indium tin oxide (ITO) anode coated glass substrate was selected, the thickness of the glass substrate being about 1 millimeter. The glass was cleaned with a commercial detergent, rinsed with deionized water and dried in a vacuum oven at 60° C. for 1 hour. Immediately before use, the glass was treated with UV ozone for 0.5 hour.

2. The ITO anode coated on the glass substrate was then placed in a vacuum deposition chamber, and a hole transport layer was applied. The hole transport layer deposition rate and layer thickness were controlled by an Inficon Model IC/5 controller. Under a pressure of about 5×10-6 Torr, a 30 nanometers thick hole transport layer of N,N'-1-naphthyl-N,N'-diphenyl-1,1'-biphenyl-4,4'-diamine was deposited at a rate of 0.6 nanometer/second from a tantalum boat.

3. Onto the hole transport layer was deposited a 40 nanometers light emitting layer of 4,4'-(2-naphthyl)-1,1'-binaphthyl (compound 13) at a rate of 0.6 nanometer/second.

4. A total 30 nanometers thick electron transport layer was deposited onto the light emitting layer through first evaporation of a 10 nanometers thick layer of tris(1,1'-biphenyl-4-yl)-1,3,5-triazine at a rate of 0.6 nanometer/second, followed by evaporation of a 20 nanometers thick layer of tri(8-hydroxyquinolinato)aluminum at the same rate.

5. A 100 nanometer cathode of a magnesium silver alloy was deposited at a total deposition rate of 0.5 nanometer/second onto the light emitting layer above by the simultaneous evaporation from two independently controlled tantalum boats containing Mg and Ag, respectively. A typical composition was 9:1 in atomic ratio of Mg to Ag. Finally, a 200 nanometer silver layer was overcoated on the Mg:Ag cathode for the primary purpose of protecting the reactive Mg from ambient moisture.

The light output form this device was 80 cd/m$^2$ when it was driven by a direct current of 31.25 mA/cm$^2$. The device emitted a blue emission with CIE color coordinates of X=0.147 and Y=0.073 measured by Minolta Chromameter CS-100.

Example VI

Organic EL devices comprising a light emitting layer of a fluorescent 1,1'-binaphthyl derivative of Formula (I) can be fabricated in the following manner:

1. A 500 Å indium tin oxide (ITO) anode coated glass substrate was selected, the thickness of the glass substrate being about 1 millimeter. The glass was cleaned with a commercial detergent, rinsed with deionized water and dried in a vacuum oven at 60° C. for 1 hour. Immediately before use, the glass was treated with UV ozone for 0.5 hour.

2. The ITO anode coated on the glass substrate was then placed in a vacuum deposition chamber, and a hole transport layer was applied. The hole transport layer deposition rate and layer thickness were controlled by an Inficon Model IC/5 controller. Under a pressure of about 5×10-6 Torr, a 30 nanometers thick hole transport layer of N,N'-1-naphthyl-N,N'-diphenyl-1,1'-biphenyl-4,4'-diamine was deposited at a rate of 0.6 nanometer/second from a tantalum boat.

3. Onto the hole transport layer was deposited a 40 nanometers light emitting layer of 4,4'-triphenylsilyl-1,1'-binaphthyl (compound 22) at a rate of 0.6 nanometer/second.

4. A total 30 nanometers thick electron transport layer was deposited onto the light emitting layer through first evaporation of a 10 nanometers thick layer of tris(1,1'-biphenyl-4-yl)-1,3,5-triazine at a rate of 0.6 nanometer/second, followed by evaporation of a 20 nanometers thick layer of tri(8-hydroxyquinolinato)aluminum at the same rate.

5. A 100 nanometer cathode of a magnesium silver alloy was deposited at a total deposition rate of 0.5 nanometer/second onto the light emitting layer above by the simultaneous evaporation from two independently controlled tantalum boats containing Mg and Ag, respectively. A typical composition was 9:1 in atomic ratio of Mg to Ag. Finally, a 200 nanometer silver layer was overcoated on the Mg:Ag cathode for the primary purpose of protecting the reactive Mg from ambient moisture.

The light output form this device was 70 cd/M$^2$ when it was driven by a direct current of 62.5 mA/cm$^2$. The device emitted a blue emission with CIE color coordinates of X=0.149 and Y=0.092 measured by Minolta Chromameter CS-100.

Example VII

These examples illustrated organic EL devices containing a light emitting layer comprised of a 1,1'-binaphthyl derivative host material and a fluorescent blue dopant material. The devices were fabricated in the following manner:

1. A 500 Å indium tin oxide (ITO) anode coated glass substrate was selected, the thickness of the glass substrate being about 1 millimeter. The glass cleaned with a commercial detergent, rinsed with deionized water and dried in a vacuum oven at 60° C. for 1 hour. Immediately before use, the glass was treated with UV ozone for 0.5 hour.

2. The ITO anode coated on the glass substrate was then placed in a vacuum deposition chamber, and a hole transport layer was applied. The hole transport layer deposition rate and layer thickness were controlled by an Inficon Model IC/5 controller. Under a pressure of about 5×10-6 Torr, a 30 nanometers thick hole transport layer was deposited on the ITO glass substrate through evaporation of N,N'-1-naphthyl-N,N'-diphenyl-1,1'-biphenyl-4,4'-diamine at a rate of 0.6 nanometer/second from a tantalum boat.

3. Onto the hole transport layer was deposited a 42 nanometers thick light emitting layer through simultaneous evaporation from two independently controlled tantalum boats of 4,4'-(2-naphthyl)-1,1'-binaphthyl (compound 13) at a rate of 0.6 nanometer/second and a fluorescent blue dopant BD2 at such a rate that 2.0 weight percent or parts of this material was doped.

4. A total 30 nanometers thick electron transport layer was deposited onto the light emitting layer through first evaporation of a 10 nanometers thick layer of tris(1,1'-biphenyl-4-yl)-1,3,5-triazine at a rate of 0.6 nanometer/second, followed by evaporation of a 20 nanometers thick layer of tri(8-hydroxyquinolinato)aluminum at the same rate.

5. A 100 nanometer cathode of a magnesium silver alloy was deposited at a total deposition rate of 0.5 nanometer/second onto the light emitting layer above by the simultaneous evaporation from two independently controlled tantalum boats containing Mg and Ag, respectively. A typical composition was 9:1 in atomic ratio of Mg to Ag. Finally, a 200 nanometer silver layer was overcoated on the Mg:Ag cathode for the primary purpose of protecting the reactive Mg from ambient moisture.

The light output form this device was 235 cd/m² when it was driven by a direct current of 31.25 mA/cm². The device emitted a blue emission with CIE color coordinates of X=0.152 and Y=0.174 measured by Minolta Chromameter CS-100.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. An electroluminescent device comprising a first electrode, an organic electroluminescent element, and a second electrode wherein said electroluminescent element includes a fluorescent 1,1'-binaphthyl derivative represented by Formula (I):

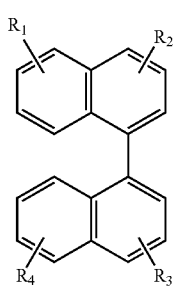

(Formula I)

wherein $R_1$ and $R_4$ are individual substituents or a group of substituents, each of which is selected from the group consisting of hydrogen; alkyl of from 1 to about 25 carbon atoms; an aryl or substituted aryl with about 6 to about 30 carbon atoms; carbon atoms necessary to complete a fused aromatic ring of naphthalene, anthracene, or perylene; an alicyclic alkyl group with from about 3 to about 15 carbon atoms; a silicon atom which can be substituted with a trimethyl, diphenylmethyl, or triphenyl group; heteroaryl or substituted heteroaryl of from 5 to 24 carbon atoms; carbon atoms necessary to complete a fused heteroaromatic ring of furyl, thienyl, pyridyl, or quinolinyl; an alkoxy, amino, alkyl amino or aryl amino of from 1 to about 25 carbon atoms; a halogen; a cyano group; and combinations thereof; and $R_2$ and $R_3$ are a silicon atom which can be substituted with a trimethyl, diphenylmethyl, or triphenyl group.

2. An electroluminescent device in accordance with claim 1 wherein said electroluminescent element includes an emitting layer comprised of a host 1,1'-binaphthyl derivative comprised of Formula (I) and a guest fluorescent or phosphorescent dye.

3. An electroluminescent device in accordance with claim 2 wherein said fluorescent or phosphorescent dye possesses a bandgap no greater than that of said host material.

4. An electroluminescent device in accordance with claim 2 wherein said fluorescent or phosphorescent dye is present in a concentration of from about 0.01 to about 10 mole percent, based on the moles of said 1,1'-binaphthyl derivative host material.

5. An electroluminescent device in accordance with claim 1 wherein said element is a layer, said first electrode is an anode, and said second electrode is a cathode.

6. An electroluminescent device in accordance with claim 1 wherein said element is comprised of a layered electroluminescent arrangement comprised of a hole transport layer, and a light emitting layer wherein 1,1'-binaphthyl derivatives are added thereto, and an electron transport layer; and which element is positioned between said first and second electrodes.

7. An electroluminescent device in accordance with claim 1 wherein said element represents a single layer, a plurality of layers, or a plurality of laminated layers.

8. An electroluminescent device comprising a first electrode, an organic electroluminescent element, and a second electrode wherein said electroluminescent element includes a fluorescent 1,1'-binaphthyl derivative represented by Formula (II):

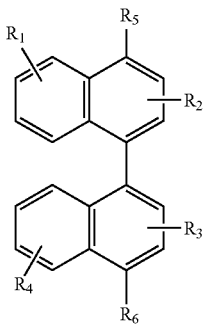

Formula (II)

wherein $R_1$, $R_2$, $R_3$ and $R_4$ are individual substituents or a group of substituents, each of which is selected from the group consisting of hydrogen; alkyl of from 1 to about 25 carbon atoms; an aryl or substituted aryl with about 6 to about 30 carbon atoms; carbon atoms necessary to complete a fused aromatic ring of naphthalene, anthracene, or perylene; an alicyclic alkyl group with from about 3 to about 15 carbon atoms; a silicon atom which can be substituted with a trimethyl, diphenylmethyl, or triphenyl group; heteroaryl or substituted heteroaryl of from 5 to 24 carbon atoms; carbon atoms necessary to complete a fused heteroaromatic ring of furyl, thienyl, pyridyl, or quinolinyl; an alkoxy, amino, alkyl amino or aryl amino of from 1 to about 25 carbon atoms; a halogen; a cyano group; and combinations thereof; and $R_5$ and $R_6$ are a silicon atom which can be substituted with a trimethyl, diphenylmethyl, or triphenyl group.

9. An electroluminescent device in accordance with claim 8 wherein said $R_5$ and $R_6$ are selected from the group consisting of trimethylsilyl and triphenylsilyl.

10. An electroluminescent device comprising a first electrode, an organic electroluminescent element, and a second electrode wherein said electroluminescent element includes a fluorescent 1,1'-binaphthyl derivative represented by Formula (III):

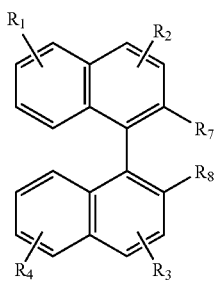

Formula (III)

wherein $R_1$ and $R_4$ are individual substituents or a group of substituents, each of which is selected from the group consisting of hydrogen; alkyl of from 1 to about 25 carbon atoms; an aryl or substituted aryl with about 6 to about 30 carbon atoms; carbon atoms necessary to complete a fused aromatic ring of naphthalene, anthracene, or perylene; an alicyclic alkyl group with from about 3 to about 15 carbon atoms; a silicon atom which can be substituted with a trimethyl, diphenylmethyl, or triphenyl group; heteroaryl or substituted heteroaryl of from 5 to 24 carbon atoms; carbon atoms necessary to complete a fused heteroaromatic ring of furyl, thienyl, pyridyl, or quinolinyl; an alkoxy, amino, alkyl amino or aryl amino of from 1 to about 25 carbon atoms; a halogen; a cyano group; and combinations thereof; $R_2$ and $R_3$ are a silicon atom which can be substituted with a trimethyl, diphenylmethyl, or triphenyl group; and $R_7$ and $R_8$ are substituents selected from the group consisting of alkyl of from 1 to about 25 carbon atoms; an alkoxy, amino, alkyl amino or aryl amino of from 1 to about 25 carbon atoms; a halogen; a cyano group; and combinations thereof.

11. An electroluminescent device in accordance with claim 10 wherein said $R_7$ and $R_8$ are selected from the group consisting of methyl, ethyl, methoxy, ethoxy, isopropoxy, butoxy, dimethylamino, diethylamino, fluorine, chlorine, bromine and cyano.

12. An electroluminescent device comprised of a first electrode, an organic electroluminescent element, and a second electrode wherein said electroluminescent element contains a fluorescent 1,1'-binaphthyl derivative represented by Formula (IV):

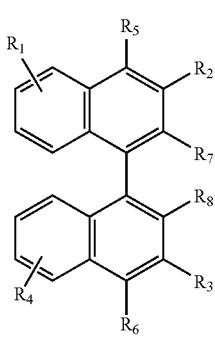

Formula (IV)

wherein $R_1$, $R_2$, $R_3$ and $R_4$ are individual substituents or a group of substituents, each of which is selected from the group consisting of hydrogen; alkyl of from 1 to about 25 carbon atoms; an aryl or substituted aryl with about 6 to about 30 carbon atoms; carbon atoms necessary to complete a fused aromatic ring of naphthalene, anthracene, or perylene; an alicyclic alkyl group with from about 3 to about 15 carbon atoms; a silicon atom which can be substituted with a trimethyl, diphenylmethyl, or triphenyl group; heteroaryl or substituted heteroaryl of from 5 to 24 carbon atoms; carbon atoms necessary to complete a fused heteroaromatic ring of furyl, thienyl, pyridyl, or quinolinyl; an alkoxy, amino, alkyl amino or aryl amino of from 1 to about 25 carbon atoms; a halogen; a cyano group; and combinations thereof; and $R_5$ and $R_6$ are a silicon atom which can be substituted with a trimethyl, diphenylmethyl, or triphenyl group; and $R_7$ and $R_8$ are substituents selected from the group consisting of alkyl of from 1 to about 25 carbon atoms; an alkoxy, amino, alkyl amino or aryl amino of from 1 to about 25 carbon atoms; a halogen; a cyano group; and combinations thereof.

13. An electroluminescent device comprised of a first electrode, an organic luminescent element, and a second electrode wherein said electroluminescent element contains a 4,4'-triphenylsilyl-1,1'-binaphthyl.

14. An organic electroluminescent device comprising in the following sequence an anode, an optional buffer layer, a hole transporting layer, a light emitting layer comprised of a 1,1'-binaphthyl derivative of Formula (I), an electron transport layer, and a cathode, wherein Formula (I) is:

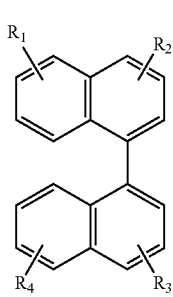

(Formula I)

wherein $R_1$ and $R_4$ are individual substituents or a group of substituents, each of which is selected from the group consisting of hydrogen; alkyl of from 1 to about 25 carbon atoms; an aryl or substituted aryl with about 6 to about 30 carbon atoms; carbon atoms necessary to complete a fused aromatic ring of naphthalene, anthracene, or perylene; an alicyclic alkyl group with from about 3 to about 15 carbon atoms; a silicon atom which can be substituted with a trimethyl, diphenylmethyl, or triphenyl group; heteroaryl or substituted heteroaryl of from 5 to 24 carbon atoms; carbon atoms necessary to complete a fused heteroaromatic ring of furyl, thienyl, pyridyl, or quinolinyl; an alkoxy, amino, alkyl amino or aryl amino of from 1 to about 25 carbon atoms; a halogen; a cyano group; and combinations thereof; and $R_2$ and $R_3$ are a silicon atom which can be substituted with a trimethyl, diphenylmethyl, or triphenyl group.

15. An electroluminescent device in accordance with claim 14 wherein said light emitting layer further comprises a fluorescent or phosphorescent dye.

16. An electroluminescent device in accordance with claim 14 wherein said anode is comprised of indium tin oxide in a thickness of from about 1 to about 500 nanometers; said buffer layer is comprised of a phthalocyanine derivative in a thickness of from, about 5 to about 80 nanometers, said hole transport layer is comprised of a tertiary aromatic amine in a thickness of from about 5 to about 300 nanometers; said light emitting layer is of a thickness of about 5 to about 300 nanometers, and said cathode is comprised of a magnesium silver alloy or a lithium aluminum alloy in a thickness of from about 10 to about 800 nanometers.

\* \* \* \* \*